United States Patent
Wu et al.

(10) Patent No.: US 12,302,515 B2
(45) Date of Patent: May 13, 2025

(54) DISPLAY DEVICE

(71) Applicant: SHENZHEN CHINA STAR OPTOELECTRONICS SEMICONDUCTOR DISPLAY TECHNOLOGY CO., LTD., Guangming New District Shenzhen (CN)

(72) Inventors: Yuanchun Wu, Guangming New District Shenzhen (CN); Xiaobo Yang, Guangming New District Shenzhen (CN)

(73) Assignee: SHENZHEN CHINA STAR OPTOELECTRONICS SEMICONDUCTOR DISPLAY TECHNOLOGY CO., LTD., Guangming New District Shenzhen (CN)

(*) Notice: Subject to any disclaimer, the term of this patent is extended or adjusted under 35 U.S.C. 154(b) by 235 days.

(21) Appl. No.: 18/077,741

(22) Filed: Dec. 8, 2022

(65) Prior Publication Data

US 2023/0269892 A1    Aug. 24, 2023

(30) Foreign Application Priority Data

Feb. 21, 2022    (CN) .......................... 202210157355.6

(51) Int. Cl.
*H05K 5/00* (2025.01)
*H05K 5/02* (2006.01)

(52) U.S. Cl.
CPC ................. *H05K 5/0221* (2013.01)

(58) Field of Classification Search
CPC ..................................................... H05K 5/0221
See application file for complete search history.

(56) References Cited

U.S. PATENT DOCUMENTS

| | | | |
|---|---|---|---|
| 2011/0128685 A1 | 6/2011 | Tokikawa et al. | |
| 2015/0009635 A1 | 1/2015 | Kang et al. | |

(Continued)

FOREIGN PATENT DOCUMENTS

| | | | |
|---|---|---|---|
| CN | 103941456 A | 7/2014 | |
| CN | 104317082 A | 1/2015 | |

(Continued)

OTHER PUBLICATIONS

CN 111862826A; English Translation (Year: 2020).*

(Continued)

*Primary Examiner* — Pete T Lee
(74) *Attorney, Agent, or Firm* — PV IP PC; Wei Te Chung

(57) ABSTRACT

Embodiments of the present application disclose a display device including a bendable display panel; a curvature adjusting mechanism, the curvature adjusting mechanism including at least one supporting back plate, the supporting back plate including a back plate body and at least one tightening-loosening member, the tightening-loosening member being deformationally linked with the back plate body; an adjusting portion movably connected to the tightening-loosening member. In the present application, the curvature of the display device may be adjusted by the cooperative work between the curvature adjusting mechanism and the adjusting portion, thereby meeting diversified user requirements.

19 Claims, 3 Drawing Sheets

(56) References Cited

U.S. PATENT DOCUMENTS

| | | | |
|---|---|---|---|
| 2016/0183399 A1 | 6/2016 | Lee et al. | |
| 2016/0379589 A1* | 12/2016 | Longo | G06F 1/1601 345/520 |
| 2018/0049329 A1* | 2/2018 | Seo | H04M 1/0216 |
| 2018/0232008 A1 | 8/2018 | Sun | |
| 2018/0259160 A1 | 9/2018 | Chen et al. | |
| 2020/0323087 A1 | 10/2020 | Hwang et al. | |
| 2021/0185835 A1* | 6/2021 | Song | G02F 1/13332 |
| 2021/0191184 A1 | 6/2021 | Zhang et al. | |

FOREIGN PATENT DOCUMENTS

| | | |
|---|---|---|
| CN | 104766539 A | 7/2015 |
| CN | 106991920 A | 7/2017 |
| CN | 107797352 A | 3/2018 |
| CN | 207781086 U | 8/2018 |
| CN | 111862826 A | 10/2020 |
| CN | 212411477 U | 1/2021 |
| CN | 112599007 A | 4/2021 |
| CN | 113539115 A | 10/2021 |
| CN | 215643450 U | 1/2022 |
| CN | 114399955 A | 4/2022 |

OTHER PUBLICATIONS

International Search Report in International application No. PCT/CN2023/075831,mailed on Jun. 15, 2023.
Written Opinion of the International Search Authority in International application No. PCT/CN2023/075831,mailed on Jun. 15, 2023.

* cited by examiner

DISPLAY DEVICE

CROSS-REFERENCE TO RELATED APPLICATIONS

This application claims the benefit of Chinese Patent Application No. 202210157355.6, filed on Feb. 21, 2022. The entire disclosure of the above application is incorporated herein by reference.

FIELD

The present application relates to a display field, in particular to a display device.

INTRODUCTION

This section provides background information related to the present disclosure which is not necessarily prior art.

Liquid crystal display panels (LCD) and organic light-emitting display panels (OLED) have been widely used in life, and a curved display device having a fixed curvature radian has been developed. However, the curvature of the conventional curved display device is fixed, and the curvature cannot be adjusted. In some usage scenarios of a user, such as when a position where the user views a display device changes, or when the user performs different operations using the display device, the curvature of the curved display device needs to be adjusted. At this time, the display device having the fixed curvature cannot meet the needs of the user.

SUMMARY OF INVENTION

Technical Problem

An embodiment of the present application provides a display device, a curvature of the display device may be adjusted, thereby solving a technical problem that a curvature of a conventional curved display device is fixed, the curvature cannot be adjusted, which cannot satisfy diversified requirements of users.

Technical Solution

An embodiment of the present application provides a display device, comprising:
 a bendable display panel;
 a curvature adjusting mechanism disposed on a back side of the display panel, and including at least one supporting back plate, wherein the supporting back plate includes a back plate body and at least one tightening-loosening member, the back plate body is disposed parallel to the display panel, the tightening-loosening member and the back plate body are deformedly linked with each other;
 an adjusting portion movably connected to the tightening-loosening member;
 wherein the tightening-loosening member comprises at least one protruding structure, each of the protruding structures includes two protruding walls arranged in a bending direction of the display panel, the protruding structure has at least one open end, the open end of the protruding structure is fixedly connected to the back plate body through the two protruding walls.

Alternatively, in some embodiments of the present application, wherein two protruding walls of each of the protruding structures are provided with through holes oppositely defined;

The adjusting portion includes at least one locking member and at least one supporting rod at least passing through two through holes of a same protruding structure;

Each of the protruding structures is at least correspondingly provided with a locking member, the locking member is provided at an outer side of the protruding walls of the protruding structure in the bending direction of the display panel;

Wherein the locking member and the supporting rod are linked to adjust a distance between the two protruding walls of the protruding structure.

Alternatively, in some embodiments of the present application, the protruding structure and the back plate body are integrally formed.

Alternatively, in some embodiments of the present application, wherein the tightening-loosening member includes a plurality of protruding structures arranged in at least one protruding structure row along the bending direction of the display panel.

Alternatively, in some embodiments of the present application, wherein a same supporting rod passes through a plurality of through holes of a plurality of protruding structures in a corresponding protruding structure row.

Alternatively, in some embodiments of the present application, wherein the tightening-loosening member includes a plurality of protruding structure rows;

The adjusting portion includes a plurality of supporting rods;

The plurality of supporting rods are arranged in parallel on the back side of the display panel in a direction perpendicular to the bending direction of the display panel.

Alternatively, in some embodiments of the present application, wherein on a plane in which the bending direction of the display panel is located, the cross-sectional shape of the protruding structure includes at least one of a rectangle, a triangle, or a circular arc shape, having an open end.

Alternatively, in some embodiments of the present application, wherein the locking member includes a nut;
 The supporting rod includes a thread structure corresponding to the nut.

Alternatively, in some embodiments of the present application, wherein the locking member includes a nut;
 The supporting rod includes a thread structure corresponding to the nut.

Alternatively, in some embodiments of the present application, wherein the locking member includes a nut;
 The supporting rod includes a thread structure corresponding to the nut.

Alternatively, in some embodiments of the present application, wherein the locking member includes a nut;
 The supporting rod includes a thread structure corresponding to the nut.

Alternatively, in some embodiments of the present application, wherein the locking member includes a nut;
 The supporting rod includes a thread structure corresponding to the nut.

Alternatively, in some embodiments of the present application, wherein the display panel includes a first side end and a second side end in the bending direction of the display panel;

The first side end and the second side end are fixedly connected to the curvature adjusting mechanism, respectively.

Alternatively, in some embodiments of the present application, wherein the display panel includes a first side end and a second side end in the bending direction of the display panel;

The first side end and the second side end are fixedly connected to the curvature adjusting mechanism, respectively.

Alternatively, in some embodiments of the present application, wherein the display panel includes a first side end and a second side end in the bending direction of the display panel;

The first side end and the second side end are fixedly connected to the curvature adjusting mechanism, respectively.

Alternatively, in some embodiments of the present application, wherein the display panel includes a first side end and a second side end in the bending direction of the display panel;

The first side end and the second side end are fixedly connected to the curvature adjusting mechanism, respectively.

Alternatively, in some embodiments of the present application, the display panel includes a display panel body and a protective cover, and the curvature adjusting mechanism is disposed on a side of the display panel body away from the protective cover;

The protective cover plate is fixedly connected to the curvature adjusting mechanism at the first side end and the second side end.

Alternatively, in some embodiments of the present application, wherein the curvature adjusting mechanism further includes first connecting members disposed corresponding to the first side end and the second side end, the first connecting members are connected between the back plate body and the display panel, and the protective cover is fixedly connected to the curvature adjusting mechanism through the first connecting members at the first side end and the second side end respectively.

Alternatively, in some embodiments of the present application, wherein the curvature adjusting mechanism further includes second connecting members disposed corresponding to the first side end and the second side end, the second connecting members are disposed on a side of the back plate body away from the first connecting members, the second connecting members include holes, and the supporting rod is movably disposed in the holes.

Alternatively, in some embodiments of the present application, wherein the curvature adjusting mechanism includes a plurality of the supporting back plates, the plurality of supporting back plates are arranged in parallel in a direction perpendicular to the bending direction of the display panel.

Advantageous Effects

In an embodiment of the present application, a display device is provided. The display device includes: a bendable display panel; a curvature adjusting mechanism disposed on a back side of the display panel, the curvature adjusting mechanism including at least one supporting back plate, the supporting back plate including a back plate body and at least one tightening-loosening member, the back plate body being disposed parallel to the display panel, the tightening-loosening member being deformed in linkage with the back plate body; an adjusting portion movably connected to the tightening-loosening member; wherein the tightening-loosening member includes at least one protruding structure, each protruding structure includes two protruding walls arranged in the bending direction of the display panel, the protruding structure has at least one open end, and the open end of the protruding structure is fixedly connected to the back plate body through the two protruding walls. By the cooperative work of the curvature adjusting mechanism and the adjusting portion, the curvature of the display device can be adjusted to satisfy the diversified requirements of users.

DRAWINGS

In order to illustrate the technical solutions in the embodiments of the present application more clearly, the accompanying drawings required in the description of the embodiments will be briefly described below. It will be apparent that the accompanying drawings in the following description are merely some embodiments of the present application, and other drawings may be obtained from these drawings without creative effort by those skilled in the art.

DETAILED DESCRIPTION

Figure 1:
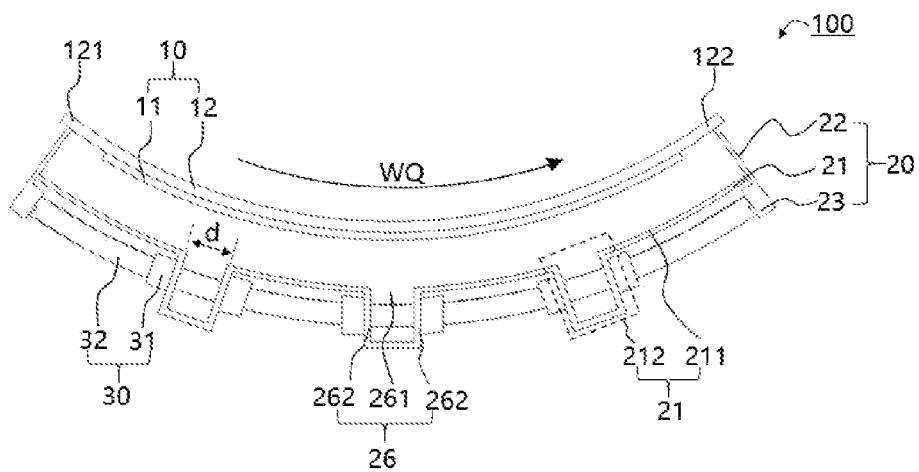
FIG. 1 is a schematic structural diagram of a top view of a three-dimensional structure of a display device according to an embodiment of the present application.

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application. Furthermore, it should be understood that the specific embodiments described herein are intended only to illustrate and explain the present application, and are not intended to limit the present application. In addition, it should be understood that the specific implementations described here are only used to illustrate and explain the present disclosure, and are not used to limit the present disclosure. In the present disclosure, unless otherwise stated, directional words used such as "upper" and "lower" generally refer to the upper and lower directions of the device in actual use or working state, and specifically refer to the drawing directions in the drawings; and "inner" and "outer" refer to the outline of the device.

An embodiment of the present application provides a display device including: a bendable display panel; a curvature adjusting mechanism disposed on a back side of the display panel, the curvature adjusting mechanism at least including one supporting back plate, the supporting back plate including a back plate body and at least one tightening-loosening member, the back plate body being disposed parallel to the display panel, the tightening-loosening member and the back plate body being deformationally linked with each other; an adjusting portion movably connected to the tightening-loosening member; wherein the tightening-loosening member includes at least one protruding structure, each protruding structure includes two protruding walls arranged in the bending direction of the display panel, the protruding structure has at least one open end, and the open end of the protruding structure is fixedly connected to the back plate body through the two protruding walls.

An embodiment of the present application provides a display device. Various embodiments will be described in detail below. It should be noted that the description order of the following embodiments is not intended to limit the preferred order of the embodiments.

Embodiment 1

Figure 2:
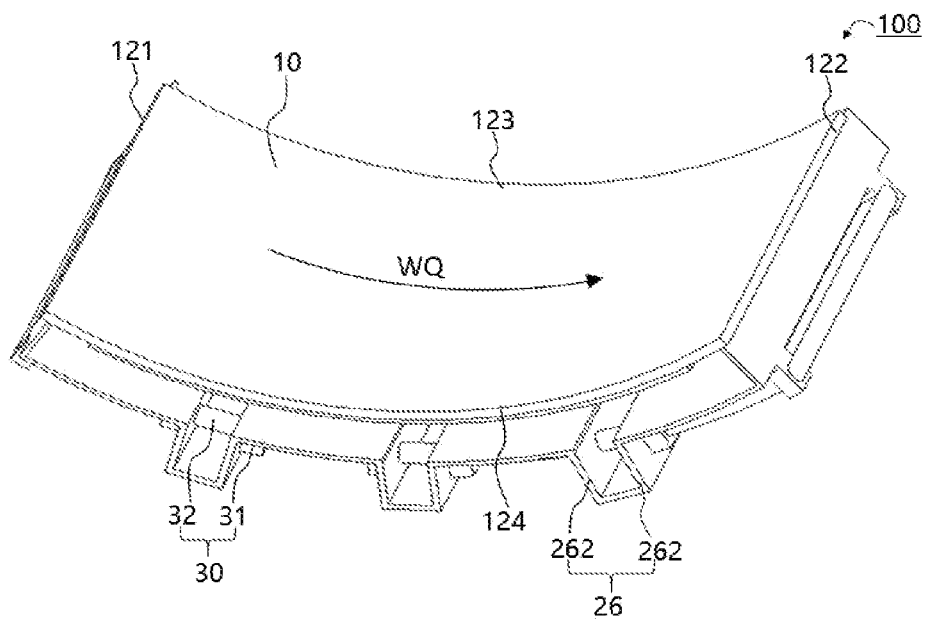
FIG. 2 is a schematic structural diagram of a three-dimensional structure of a display device after being placed horizontally according to an embodiment of the present application.
Figure 3:
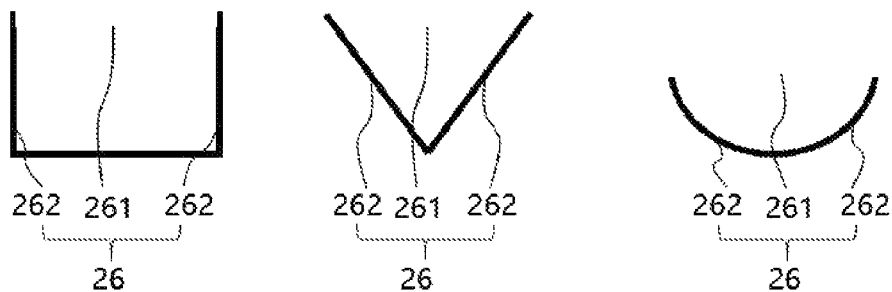
FIG. 3 is a schematic structural diagram of a cross-sectional view of a protruding structure of a display device in a plane in which a bending direction of a display panel is located according to an embodiment of the present application.
Figure 4:
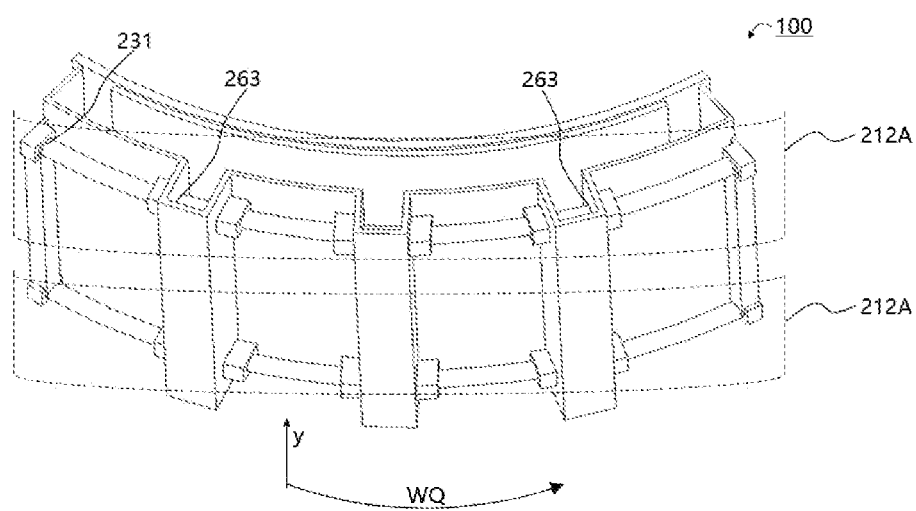
FIG. 4 is a schematic structural diagram of a backside three-dimensional structure of a display device according to an embodiment of the present application.
Figure 5:
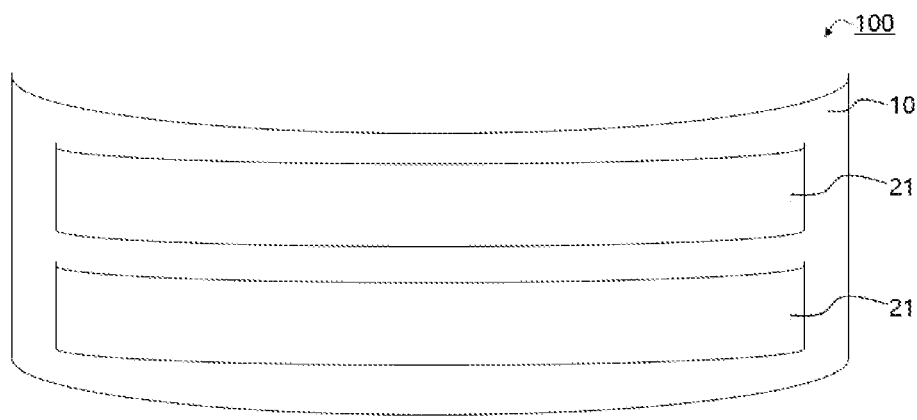
FIG. 5 is a simplified schematic diagram of a rear view of a display device according to an embodiment of the present application.

Referring to FIGS. 1, 2, 3, 4, and 5, FIG. 1 is a schematic structural diagram of a top view of a three-dimensional structure of a display device 100 according to an embodiment of the present application; FIG. 2 is a schematic structural diagram of a three-dimensional structure of a display device 100 after being placed horizontally according to an embodiment of the present application; FIG. 3 is a schematic structural diagram of a cross-sectional view of a protruding structure of a display device 100 in a plane in which a bending direction of a display panel is located according to an embodiment of the present application; FIG. 4 is a schematic structural diagram of a backside three-dimensional structure of a display device 100 according to an embodiment of the present application; FIG. 5 is a simplified schematic diagram of a rear view of a display device 100 according to an embodiment of the present application. It should be noted that FIG. 1 is a schematic top view of the three-dimensional structure of a display device 100 according to an embodiment of the present application, or FIG. 1 is a schematic cross-sectional view of the display device in a plane in which a bending direction of a display panel is located.

An embodiment of the present application provides a display device 100, the display panel 100 includes a flexible display panel 10, a curvature adjusting mechanism 20, and an adjusting portion 30. The curvature adjusting mechanism 20 is disposed on the backside of the display panel 10. The curvature adjusting mechanism 20 includes at least one supporting back plate 21. The supporting back plate 21 includes a back plate body 211 and at least one tightening-loosening member 212. The back plate body 211 is arranged parallel to the display panel 10, the tightening-loosening member 212 and the back plate body 211 are deformed in linkage with each other. The adjusting portion 30 is movably connected to the tightening-loosening member 212. Wherein the tightening-loosening member 212 includes at least one protruding structure 26, each of the protruding structures 26 includes two protruding walls 262 arranged in the bending direction WQ of the display panel 10, the protruding structure 26 has at least one open end 261, the open end 261 of the protruding structure 26 is fixedly connected to the back plate body 211 through the two protruding walls 262.

Specifically, the display device 100 includes the bendable display panel 10, the curvature adjusting mechanism 20, and the adjusting portion 30, and the curvature adjusting mechanism 20 and the adjusting portion 30 are used to adjust a bending degree of the bendable display panel 10, thereby realizing adjustment of a curvature of the display device 100.

Specifically, the flexible display panel 10 may be any display panel, may be an organic light emitting display panel (OLED), or may be a liquid crystal display panel (LCD), which is not limited here.

Specifically, the curvature adjusting mechanism 20 includes the at least one supporting back plate 21, which includes the back plate body 211 and the at least one tightening-loosening member 212, and the back plate body 211 is disposed parallel to the display panel 10. The display panel 10 is bent in the bending direction WQ, and the back plate body 211 is also bent in the bending direction WQ.

Specifically, the adjusting portion 30 is movably connected to the tightening-loosening member 212 to adjust a tightening-loosening degree of the tightening-loosening member 212. The adjusting portion 30 may adjust the tightening-loosening degree of the tightening-loosening member 212, and the adjusting portion 30 may also fix the state of the tightening-loosening member 212 after the tightening-loosening degree is changed.

Specifically, the tightening-loosening degree of the tightening-loosening member 212 may be adjusted by the adjusting portion 30, which may be realized by changing a position of the adjusting portion 30 by an external force to adjust the tightening-loosening degree of the tightening-loosening member 212.

Specifically, the tightening-loosening member 212 and the back plate body 211 are deformed in linkage with each other. The tightening-loosening member 212 includes at least one protruding structure 26, the protruding structure 26 having at least one open end 261. The open end 261 of the protruding structure 26 is fixedly connected to the back plate body 211. The tightening-loosening degree of the tightening-loosening member 212 refers to the tightening-loosening degree of the protruding structure 26.

Specifically, the tightening-loosening degree of the protruding structure 26 refers to opening and tightening of the protruding structure 26.

More specifically, each protruding structure 26 includes two protruding walls 262 arranged in the bending direction WQ of the display panel 10, the open end 261 of the protruding structure 26 is fixedly connected to the back plate body 211 through the two protruding walls 262, and the tightening-loosening degree of the protruding structure 26 refers to a change in a distance d between two connecting portions between the two protruding wall 262 of a same protruding structure 26 and the back plate body 211 increases or decreases.

More specifically, when the protruding structure 26 is opened, the distance d between the two connecting portions between the two protruding walls 262 of the same protruding structure 26 and the back plate body 211 increases; when the protruding structure 26 is tightened, the distance d between the two connecting portions between the two protruding walls 262 of the same protruding structure 26 and the back plate body 211 is reduced.

In the embodiment of the present application, by adjusting the tightening-loosening degree of the tightening-loosening member 212 or the protruding structure 26, the deformation linkage between the tightening-loosening member 212 or the protruding structure 26 and the back plate body 211 is adjusted so that the distance between the two connecting portions between the two protruding walls 262 of the same protruding structure 26 and the back plate body 211 increases or decreases, thereby adjusting the bending degree or the curvature of the display device. At a same time, the adjusting portion 30 plays a role of fixing and the adjusted tightening-loosening degree of the tightening-loosening member 212 or the protruding structure 26, so that the display device 100 maintains an adjusted curvature state. In the present embodiment, the curvature of the display device 100 may be adjusted by operating the curvature adjusting mechanism 20 in linkage with the adjusting portion 30, thereby meeting diversified needs of users.

Embodiment 2

This embodiment is same as or similar to the above embodiment, except that the structure of the display device 100 is further described.

In some embodiments, each protruding structure 26 is provided with through holes 263 oppositely defined on the two protruding walls 262; the adjusting portion 30 includes at least one locking member 31 and at least one supporting rod 32, the supporting rod 32 at least passes through two through holes 263 of a same protruding structure 26; each protruding structure 26 is correspondingly provided with at least one locking member 31, the locking member 31 is disposed at an outer side of the protruding wall 262 of the protruding structure 26 along the bending direction WQ of the display panel 10; wherein the locking member 31 and the supporting rod 32 are linked to adjust the distance between the two protruding walls 262 of the protruding structure 26.

Specifically, each protruding structure 26 includes two protruding walls 262 arranged in the bending direction WQ of the display panel 10. At this time, the tightening-loosening member 212 is the protruding structure 26, and the connecting portion between the tightening-loosening member 212 and the back plate body 211 is a portion where the protruding wall 262 is connected to the back plate body 211.

Specifically, each protruding structure 26 includes two protruding walls 262 arranged in the bending direction WQ of the display panel 10. By changing the distance between the two protruding walls 262 of the same protruding structure 26, a change in an increase or decrease of the distance d between the connection portions between the protruding structure 26 and the back plate body 211 may be changed.

Specifically, the two protruding walls 262 are provided with through holes 263 oppositely defined, that is, through holes 263 in the two protruding walls 262 of the same protruding structure 26 are arranged in the bending direction WQ, and the supporting rod 32 passes through the through holes 263 and is arranged parallel to the bending direction WQ.

Specifically, each of the protruding structures 26 is provided with at least one locking member 31, the locking member is provided on an outer side of the protruding wall 262 of the protruding structure 26 in the bending direction WQ of the display panel 10, the locking member 31 is provided on the supporting rod 32, and a position of the locking member 31 is changed or fixed by the supporting rod 32.

Specifically, each protruding structure 26 is correspondingly provided with at least one locking member 31.

Further, it is preferable that each protruding structure 26 is correspondingly provided with two locking members 31, and the two locking members 31 are provided on the outer side of the two protruding walls 262 of the same protruding structure 26, so that the distance between the two protruding walls 262 is simultaneously adjusted at two outer sides of the two protruding walls 262, and the curvature of the display device 100 may be more uniformly adjusted so that stress at all parts of the display device 100 tends to be uniform or regular.

Specifically, the locking member 31 and the supporting rod 32 adjust the distance between the two protruding walls 262 of the protruding structure 26 jointly, that is, by adjusting the position of the locking member 31 on the supporting rod 32, a force is applied to the two protruding walls 262 of the protruding structure 26, so that the distance d between the two connecting portions between the two protruding walls 262 and the back plate body 211 changes, thereby serving to adjust the curvature of the display device 100. At a same time, after adjusting the position of the locking member 31, the locking member 31 may be fixed on the supporting rod 32, thereby maintaining the distance between the two connecting portions between the two protruding walls 262 and the back plate body 211, that is, maintaining the tightening-loosening degree of the protruding structure 26, that is, maintaining a certain curvature of the display device 100. When the curvature of the display device 100 is required to be adjusted next time, the position of the locking member 31 on the supporting rod 32 is adjusted again, thereby maintaining the display device 100 in another curvature.

In some embodiments, the protruding structure 26 and the back plate body 211 are integrally formed.

Specifically, the protruding structure 26 and the back plate body 211 are integrally formed to simplify manufacturing process, and at a same time, allows the protruding structure 26 and the back plate body 211 to be better linked.

In some embodiments, the tightening-loosening member 212 includes a plurality of protruding structures 26, the plurality of protruding structures 26 are arranged in at least one protruding structure row 212A along the bending direction WQ of the display panel 10.

Specifically, the tightening-loosening member 212 includes a plurality of protruding structures 26, the plurality of protruding structures 26 are arranged in at least one protruding structure row 212A along the bending direction WQ of the display panel 10, and the plurality of protruding structures 26 are uniformly or regularly distributed in the bending direction WQ, so that the curvature of the display device 100 may be uniformly adjusted, and the curvature or the bending degree of the display device 100 is more consistent with the requirements of users.

In some embodiments, the same supporting rod 32 passes through a plurality of through holes 263 in a plurality of protruding structures 26 of a corresponding protruding structure row 212A.

Specifically, a same supporting rod 32 passes through the plurality of through holes 263 in the plurality of protruding structures 26 of the corresponding protruding structure row 212A. In this protruding structure row 212A, it is only necessary to adjust the positions of the plurality of locking members 31 linked by the corresponding plurality of protruding structures on the same supporting rod 32, so that the stresses at the respective parts of the display device 100 are uniform or regular, and the curvature of the display device 100 may be uniformly adjusted so that the curvature or the bending degree of the display device 100 is more consistent with the requirements of users.

In some embodiments, the tightening-loosening member 212 includes a plurality of protruding structure rows 212A; the adjusting portion 30 includes a plurality of supporting rods 32; the plurality of supporting rods 32 are arranged in parallel on the back side of the display panel 10 in a direction perpendicular to the bending direction WQ of the display panel 10.

Specifically, as shown in FIG. 4, by arranging the plurality of protruding structure rows 212A and the plurality of corresponding supporting rods 32, the curvature of the display device 100 may be uniformly adjusted in a first direction y perpendicular to the bending direction WQ, so that the stresses at the respective parts of the display device 100 are uniform or regular, and the curvature or the bending degree of the display device 100 may be more consistent with the requirements of users.

In some embodiments, the cross-sectional shape of the protruding structure 26 includes at least one of a rectangle, a triangle, or a circular arc shape having an open end, on a plane where the bending direction WQ of the display panel 10 is located.

Specifically, the protruding structures 26 may have various shapes, for example, a rectangle with an open end, a triangle with an open end, or a circular arc shape with an open end, all of which may realize the adjustment of the curvature of the display device 100 as described above.

In some embodiments, the locking member 31 includes a nut; the supporting rod 32 includes a thread structure corresponding to the nut.

Specifically, the locking member 31 may include the nut, the supporting rod 32 has a thread corresponding to the nut, and the position of the locking member 31 on the supporting rod 32 may be changed by rotating, tightening, or loosening the nut, thereby realizing adjustment of the curvature of the display device 100.

In an embodiment of the present application, the distance between the connecting portions between the same protruding structure 262 and the back plate body 211 is changed to increase or decrease by adjusting the position of the locking member 31 on the supporting rod 32, or the distance d between the two connecting portions between the two protruding walls 262 of the same protruding structure 26 and the back plate body 211 is changed, thereby adjusting the bending degree or the curvature of the display device. In the present embodiment, the curvature of the display device 100 may be adjusted through the cooperative work between the locking member 31 and the supporting rod 32, thereby meeting the diversified requirements of users.

Embodiment 3

This embodiment is same as or similar to the above embodiment, except that the structure of the display device 100 is further described.

In some embodiments, the display panel 10 includes a first side end 121 and a second side end 122 in a bending direction WQ thereof; the first side end 121 and the second side end 122 are fixedly connected to the curvature adjusting mechanism 20, respectively.

Specifically, the first side end 121 and the second side end 122 are fixedly connected to the curvature adjusting mechanism 20, respectively. In this case, deformation of the curvature adjusting mechanism 20 or the change in the tightening-loosening degree of the protruding structure 26 of the curvature adjusting mechanism 20 may be transmitted to the first side end 121 and the second side end 122, so that the curvature of the first side end 121 and the second side end 122 of the display device 100 also changes, this enables the curvature of the display device 100 to be uniformly adjusted, the stresses at the respective parts of the display device 100 are uniform or regular, and the curvature or the bending degree of the display device 100 is more consistent with the requirements of users.

Specifically, the display panel 10 further includes a third side end 123 and a fourth side end 124 located between the first side end 121 and the second side end 122. The third side end 123 and the fourth side end 124 are non-fixedly connected to the curvature adjusting mechanism 20, so that a shape of the display panel 10 in the bending direction WQ may be changed without being fixed by the curvature adjusting mechanism 20.

In some embodiments, the display panel 10 includes a display panel body 11 and a protective cover 12, and the curvature adjusting mechanism 20 is provided on a side of the display panel body 11 away from the protective cover 12; at the first side end 121 and the second side end 122, the protective cover 12 is fixedly connected to the curvature adjusting mechanism 20.

Specifically, the protective cover 12 is a cove glass (CG), and the protective cover 12 is fixedly connected to the curvature adjusting mechanism 20, thus, the stress is transmitted to the protective cover 12. Generally, the protective cover 12 has greater mechanical strength than the display panel body 11, thereby avoiding damage to the display panel body 11 during curvature adjustment.

In some embodiments, the curvature adjusting mechanism 20 further includes first connecting members 22 provided corresponding to the first side end 121 and the second side end 122, the first connecting member 22 is connected between the back plate body 211 and the display panel 10, and the protective cover 12 is fixedly connected to the curvature adjusting mechanism 20 through the first connecting members 22 at the first side end 121 and the second side end 122.

Specifically, the first connecting member 22 is connected between the back plate body 211 and the display panel 10, and the protective cover 12 is fixedly connected to the curvature adjusting mechanism 20 through the first connecting member 22 at the first side end 121 and the second side end 122, so that the curvature adjusting mechanism 20 is not closely attached to or connected to the display panel body 11, so that there is a certain gap or space between the curvature adjusting mechanism 20 and the display panel body 11, and the display panel 10 may not be directly damaged when the shape of the curvature adjusting mechanism 20 changes.

In some embodiments, the curvature adjusting mechanism 20 further includes second connecting members 23 correspondingly disposed at the first side end 121 and the second side end 122, the second connecting members 23 are disposed at a side of the back plate body 211 away from the first connecting member 22, the second connecting member 23 includes a hole 231, the supporting rod 32 is movably disposed in the hole 231.

Specifically, the second connecting member 23 is provided on a side of the back plate body 211 away from the first connecting member 22, the second connecting member 23 is used for movably fixing the supporting rod 32.

Specifically, the second connecting member 23 includes the hole 231, the supporting rod 32 is movably disposed in the hole 231. When the tightening-loosening degree of the protruding structure 26 corresponding to the supporting rod 32 changes, length of the supporting rod 32 corresponding to the display panel body 11 may change, and the second connecting member 23 may accommodate or release the portion of the supporting rod 32 that changed in length. For example, the protruding structure 26 is tightened or the distance between the protruding walls 262 is reduced, the length of the supporting rod 32 facing the display panel body 11 is reduced, and a portion of the supporting rod 32 is accommodated in the second connecting member 23.

Specifically, the supporting rod 32 is movably disposed in the hole 231, so that the length of the display panel body 11 facing the supporting rod 32 may be adjusted as the curvature changes.

Specifically, the second connecting member 23 is movable connected to the supporting rod 32 through a nut, a fastener, or the like, and it is not limited here.

It should be noted that, as shown in FIG. 5, in some embodiments, in the display device 100, the curvature adjusting mechanism 20 includes a plurality of supporting back plates 21, the plurality of supporting back plates 21 are arranged in parallel in a direction perpendicular to the bending direction WQ of the display panel 10. The curvature of the display device 100 may be uniformly adjusted in the direction perpendicular to the bending direction WQ, so that the stresses at various parts of the display device 100 are uniform or regular, and the curvature or the bending degree of the display device 100 is more consistent with the requirements of users.

The display device provided in the embodiments of the present application is described in detail above. The principles and implementations of the present application are described in detail here with specific examples. The above description of the embodiments is merely intended to help understand the method and core ideas of the present application. At the same time, a person skilled in the art may make changes in the specific embodiments and application scope according to the idea of the present application. In conclusion, the content of the present specification should not be construed as a limitation to the present application.

What is claimed is:

1. A display device comprising:
   a bendable display panel;
   a curvature adjusting mechanism disposed on a back side of the display panel, the curvature adjusting mechanism comprising at least one supporting back plate, each of the at least one supporting back plate comprising a back plate body and at least one tightening-loosening member, the back plate body is disposed parallel to the display panel, the at least one tightening-loosening member and the back plate body are deformedly linked with each other;
   an adjusting portion movably connected to the at least one tightening-loosening member;
   wherein each of the at least one tightening-loosening member comprises at least one protruding structure, each of the at least one protruding structure comprises two protruding walls arranged in a bending direction of the display panel, the each of the at least one protruding structure has at least one open end, the at least one open end of the each of the at least one protruding structure is fixedly connected to the back plate body through the two protruding walls,
   wherein two protruding walls of the each of the at least one protruding structure are provided with through holes oppositely defined;
   the adjusting portion comprises at least one locking member and at least one supporting rod, the supporting rod passing through at least two through holes of a same protruding structure;
   the each of the at least one protruding structure is at least correspondingly provided with a locking member, the locking member is provided at an outer side of the protruding walls of a corresponding protruding structure in the bending direction of the display panel;
   wherein the at least one locking member and the at least one supporting rod are linked to adjust a distance between the two protruding walls of the each of the at least one protruding structure.

2. The display device according to claim 1, wherein the at least one protruding structure and the back plate body are integrally formed.

3. The display device according to claim 1, wherein the each of the at least one tightening-loosening member comprises a plurality of protruding structures arranged in at least one protruding structure row along the bending direction of the display panel.

4. The display device according to claim 3, wherein a same supporting rod passes through a plurality of through holes of a plurality of protruding structures in a corresponding protruding structure row.

5. The display device according to claim 4, wherein the each of the at least one tightening-loosening member comprises a plurality of protruding structure rows;
   the adjusting portion comprises a plurality of supporting rods;
   the plurality of supporting rods are arranged in parallel on the back side of the display panel in a direction perpendicular to the bending direction of the display panel.

6. The display device according to claim 1, wherein on a plane in which the bending direction of the display panel is located, a cross-sectional shape of the at least one protruding structure comprises at least one of a rectangle, a triangle, or a circular arc shape, having an open end.

7. The display device according to claim 1, wherein each of the at least one locking member comprises a nut;
   each of the at least one supporting rod comprises a thread structure corresponding to the nut.

8. The display device according to claim 2, wherein each of the at least one locking member comprises a nut;
   each of the at least one supporting rod comprises a thread structure corresponding to the nut.

9. The display device according to claim 3, wherein each of the at least one locking member comprises a nut;
   each of the at least one supporting rod comprises a thread structure corresponding to the nut.

10. The display device according to claim 4, wherein each of the at least one locking member comprises a nut;
    each of the at least one supporting rod comprises a thread structure corresponding to the nut.

11. The display device according to claim 5, wherein each of the at least one locking member comprises a nut;
    each of the at least one supporting rod comprises a thread structure corresponding to the nut.

12. The display device according to claim 1, wherein the display panel comprises a first side end and a second side end in the bending direction of the display panel;
    the first side end and the second side end are fixedly connected to the curvature adjusting mechanism, respectively.

13. The display device according to claim 2, wherein the display panel comprises a first side end and a second side end in the bending direction of the display panel;
    the first side end and the second side end are fixedly connected to the curvature adjusting mechanism, respectively.

14. The display device according to claim 3, wherein the display panel comprises a first side end and a second side end in the bending direction of the display panel;
    the first side end and the second side end are fixedly connected to the curvature adjusting mechanism, respectively.

15. The display device according to claim 4, wherein the display panel comprises a first side end and a second side end in the bending direction of the display panel;

the first side end and the second side end are fixedly connected to the curvature adjusting mechanism, respectively.

16. The display device according to claim 12, wherein the display panel comprises a display panel body and a protective cover, the curvature adjusting mechanism is provided on a side of the display panel body away from the protective cover;

the protective cover is fixedly connected to the curvature adjusting mechanism at the first side end and the second side end.

17. The display device according to claim 16, wherein the curvature adjusting mechanism further comprises first connecting members disposed corresponding to the first side end and the second side end, the first connecting members are connected between the back plate body and the display panel, the protective cover is fixedly connected to the curvature adjusting mechanism through the first connecting members at the first side end and the second side end respectively.

18. The display device according to claim 17, wherein the curvature adjusting mechanism further comprises second connecting members disposed corresponding to the first side end and the second side end, the second connecting members are disposed on a side of the back plate body away from the first connecting members, the second connecting members comprise holes, and the supporting rod is movably disposed in the holes.

19. The display device according to claim 1, wherein the curvature adjusting mechanism comprises a plurality of the supporting back plates arranged in parallel in a direction perpendicular to the bending direction of the display panel.

* * * * *